(12) United States Patent
Degenhardt

(10) Patent No.: US 7,361,897 B2
(45) Date of Patent: Apr. 22, 2008

(54) IMAGING APPARATUS FOR HIGH PROBE CURRENTS

(75) Inventor: Ralf Degenhardt, Landsham (DE)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 240 days.

(21) Appl. No.: 11/370,224

(22) Filed: Mar. 7, 2006

(65) Prior Publication Data
US 2006/0219915 A1    Oct. 5, 2006

(30) Foreign Application Priority Data
Mar. 8, 2005    (EP)    .................. 05005028

(51) Int. Cl.
*H01J 3/14*     (2006.01)
*H01J 37/26*    (2006.01)
*G01N 23/00*    (2006.01)
(52) U.S. Cl. ............... 250/311; 250/306; 250/307; 250/396 R; 250/492.2
(58) Field of Classification Search ............. None
See application file for complete search history.

(56) References Cited

U.S. PATENT DOCUMENTS

| | | | |
|---|---|---|---|
| 4,962,313 A | 10/1990 | Rose | |
| 5,309,541 A | 5/1994 | Flint | |
| 6,384,412 B1 | 5/2002 | Krahl et al. | |
| 2002/0104966 A1* | 8/2002 | Plies et al. | .................. 250/311 |
| 2007/0069150 A1* | 3/2007 | Frosien et al. | ....... 250/396 ML |

FOREIGN PATENT DOCUMENTS

| | | |
|---|---|---|
| EP | 373399 A2 | 6/1990 |
| EP | 0646821 A2 | 4/1995 |
| EP | 0967630 A2 | 12/1999 |
| EP | 1432006 A2 | 6/2004 |
| EP | 1517353 A2 | 3/2005 |
| GB | 2328073 A | 2/1999 |
| GB | 2404783 A | 2/2005 |

OTHER PUBLICATIONS

European Search Report dated Dec. 5, 2006.
H. Rose. "Inhomogeneous Wien filter as a corrector compensating for the chromatic and spherical aberration of low-voltage electron microscopes." Optik. 1990 vol. 84(3): pp. 91-107.

* cited by examiner

*Primary Examiner*—Nikita Wells
(74) *Attorney, Agent, or Firm*—Patterson & Sheridan, LLP

(57) ABSTRACT

An imaging apparatus is provided, comprising a first lens, a Wien filter having a first opening and a second opening, and further comprising a 2*m-pole element, m≧2, and a second lens, wherein said first lens is disposed upstream said first opening of the Wien filter and said second lens is disposed downstream said second opening of the Wien filter, and an intermediate image plane of the first lens is located between said first opening and said first lens and an intermediate object plane of the second lens is located between said second opening and said second lens, and wherein said Wien filter is adapted for dispersion-free imaging of a stigmatic image formed in said intermediate image plane of said first lens into a stigmatic image formed in said intermediate object plane of said second lens.

27 Claims, 10 Drawing Sheets

IMAGING APPARATUS FOR HIGH PROBE CURRENTS

FIELD OF THE INVENTION

The invention relates to an imaging apparatus for a charged particle beam and a charged particle beam apparatus, particularly to an imaging apparatus and a charged particle beam apparatus which are adapted for high probe currents. The invention further relates to a method of operating an imaging apparatus for a charged particle beam apparatus.

BACKGROUND OF THE INVENTION

Charged particle beam apparatuses have many functions in a plurality of applications, including, but not limited to, inspection of semiconductor devices during manufacturing, exposure systems for lithography, detecting devices and testing systems. Thus, there is a high demand for structuring and inspecting specimens within the micrometer and nanometer scale.

Sub-micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

The charged particle beam devices used in the field of semiconductor industry comprise lithographic devices, inspection devices as well as CD (critical dimension) measurement and DR (defect review) devices. Typically, low voltage electron microscopy is used for semiconductor inspection and metrology to avoid charging of the semiconductor substrate and damage resulting there from. Typically, only particle energies up to 2 keV or 3 keV are used in low energy microscopy.

However, in modern low voltage electron microscopes, aberrations limit the achievable resolution to a couple of nanometers for 1 keV electron energy and considerable effort has been done to optimize the lens aberrations, especially those of the objective lens.

For low energy applications, chromatic aberration is dominant. The diameter of the aberration disc of the chromatic aberration in the Gaussian image plane is proportional to the relative energy width $\Delta E/E$ of the charged particle beam. It is already known to utilize monochromators, in order to further increase the resolution. Thereby, the energy width $\Delta E$ of the electron beam, which is processed subsequently by the downstream electron-optical imaging system, can be reduced.

Wien filters are known as monochromators for charged particles wherein an electrostatic dipole field and a magnetic dipole field are superimposed perpendicularly to each other. For example, EP 0 373 399 describes a corrector comprising a Wien filter with an octupole element having a specific symmetry of the fundamental electron trajectories. Furthermore, EP 03028694.2 (Frosien et al.) describes a Wien filter monochromator with a superimposed quadrupole field that allows for improved reduction of chromatic aberration. In this Wien filter monochromator, a lens focuses the charged particle beam to the center plane of the Wien filter. However, this approach demands the use of comparatively small apertures or diaphragms for limiting the aperture angle from which charged particles are allowed to enter the Wien filter. Typically, apertures used for such applications have an opening width of 1 µm to 15 µm. Therefore, the maximum beam current that can be provided on the sample is limited by the small apertures or diaphragms. This, in turn, limits the range of possible applications for such a charged particle beam apparatus.

Particularly, some applications require high beam currents. Due to the above described limitations of the Wien filter monochromator, such a device is not adapted for a high probe current mode of a charged particle beam device.

One example requiring a high probe current mode is energy dispersive X-ray (EDX) analysis applications which demand a sufficiently high probe current. Typically, the beam currents required for EDX analysis are about ten to hundred times larger than the beam currents allowed by the above-described apertures. During EDX analysis, the charged particles collide with the electrons of the sample atoms and eject some of them. The vacant inner shell electron position is eventually occupied by a higher-energy electron from an outer shell. The energy difference between the inner and outer shell electron states is emitted as an X-ray photon. Since each atom has a specific shell structure, an analysis of the collected X-ray spectrum reveals not only the species of the inspected atoms but also their relative amount in the sample. Therefore, EDX analysis is an interesting tool for sample inspection.

Another example requiring a high probe current mode is wavelength dispersive X-ray (WDX) analysis which is used for analyzing specimens. In WDX analysis, the detector counts the impinging X-ray photons in terms of their characteristic wavelengths. Compared to EDX analysis, WDX analysis typically provides a better energy resolution and lower background noise. However, WDX analysis typically is more time consuming and requires even higher beam currents.

A further example requiring a high probe current mode is electron beam inspection of integrated circuits. Therein, the electron beam is used to charge in a controlled way certain areas of the integrated circuit to be inspected. The throughput of such an inspection system is determined by the charge that can be applied within a certain time, i.e. by the beam current. Since throughput is significant for the semiconductor industry, sufficiently high probe currents are used to achieve fast charging of the inspected semiconductor devices.

It is therefore an object of the present invention to provide an improved charged particle beam apparatus which overcomes the above described disadvantages of the prior art at least in part. Particularly, it is an object of the present invention to provide a charged particle beam apparatus that is adapted for high probe currents.

SUMMARY OF THE INVENTION

This object is solved by an imaging apparatus, a charged particle apparatus, a method for operating an imaging apparatus, a method for operating a charged particle apparatus according to embodiments of the present invention. Further aspects, advantages, features and details of the present invention, are also described in the description and the accompanying drawings.

One aspect of the present invention provides an imaging apparatus, comprising a first lens, a Wien filter having a first opening and a second opening, and further comprising a 2*m-pole element, wherein, m≧2, a second lens, wherein said first lens is disposed upstream of said first opening of the Wien filter and said second lens is disposed downstream of said second opening of the Wien filter, and an intermediate image plane of the first lens is located between said first opening and said first lens and an intermediate object plane of the second lens is located between said second opening and said second lens, and wherein said Wien filter is adapted for dispersion-free imaging of a stigmatic image formed in said intermediate image plane of said first lens into a stigmatic image formed in said intermediate object plane of said second lens.

Another aspect of the present invention provides a charged particle apparatus comprising a charge particle source, an imaging apparatus including a first lens, a Wien filter having a first opening and a second opening, and further comprising a 2*m-pole element, wherein, m≧2, a second lens, wherein said first lens is disposed upstream of said first opening of the Wien filter and said second lens is disposed downstream of said second opening of the Wien filter, and an intermediate image plane of the first lens is located between said first opening and said first lens and an intermediate object plane of the second lens is located between said second opening and said second lens, and wherein said Wien filter is adapted for dispersion-free imaging of a stigmatic image formed in said intermediate image plane of said first lens into a stigmatic image formed in said intermediate object plane of said second lens, wherein the charged particle apparatus is adapted to switch between a high probe current mode and a monochromator mode.

Another aspect of the present invention provides a method of operating an imaging apparatus, comprising: (a) forming a stigmatic image essentially in an intermediate image plane of a first lens, dispersion-free imaging of said stigmatic image essentially into an intermediate object plane of a second lens, and forming a stigmatic image essentially in the intermediate object plane of the second lens.

Another aspect of the present invention provides a method of operating a charged particle apparatus, comprising the steps of operating said charged particle apparatus in a high probe current mode or a monochromator mode, and switching said charged particle apparatus into a monochromator mode or a high probe current mode.

According to a first aspect of the present invention, an imaging apparatus for a charged particle beam is provided. Hereby, the term "imaging apparatus" refers to a device, without considerable constraints on the coefficients of spherical aberration, $C_S$, and chromatic aberration, $C_C$. Of course, the values of the aberration coefficients may not lie beyond any limits but the imaging apparatus is not as restricted as a corrector. For example, the corrector described in EP 0 373 399 must simultaneously fulfill eight conditions (cf. Appendix A of EP 0 373 399). In combination therewith, the fundamental rays within the corrector fulfill a double-symmetry condition: They are symmetric with respect to the center plane of the corrector and are symmetric within each half of the corrector. In contrast, it is not required in the imaging apparatus according to the present invention that the fundamental rays are symmetric within each half of the imaging apparatus. Furthermore, the seventh condition cited in Annex A of EP 0 373 399, which is hereby incorporated by reference, is necessary for correction of chromatic aberration, i.e. $C_C$. For example, this condition may not be fulfilled in an imaging apparatus according to the present invention. Nevertheless, the imaging apparatus not fulfilling the seventh condition realizes the present invention. Likewise, the eighth condition cited in Annex A of EP 0 373 399 is necessary for correction of spherical aberration. For example, this condition may not be fulfilled in an imaging apparatus according to the present invention. Nevertheless, the imaging apparatus not fulfilling the eighth condition realizes the present invention. The third condition cited in Annex A of EP 0 373 399 reflects the rotational symmetry of the beam. Even this condition is not a necessary condition for an imaging apparatus according to the present invention: Also without fulfilling this condition the imaging apparatus still realizes the present invention. Moreover, it should be understood that not only a single one of the above cited conditions of EP 0 373 399 may be disregarded but even a combination of these conditions may not be fulfilled in an imaging apparatus according to the present invention. From the foregoing it should be clear that a corrector, e.g. the one described in EP 0 373 399, is much more constrained in its design compared to the imaging apparatus according to the present invention. Especially, the imaging apparatus according to the present invention may be specifically designed to not fulfill the third, seventh, or eighth condition or any combination thereof cited in EP 0 373 399 or to provide a double-symmetry as described above.

The imaging apparatus according to the first aspect of the present invention comprises a first lens for focusing a charged particle beam, a Wien filter with an entrance opening and an exit opening and a second lens for focusing the beam of charged particles. The Wien filter further comprises a 2*m-pole element, m≧2, wherein 2*m is the number of poles. Accordingly, the Wien filter comprises at least a quadrupole element. The first lens is located upstream of the entrance opening of the Wien filter and the second lens is disposed downstream of the exit opening of the Wien filter. In this context, the terms "upstream" and "downstream" are defined with respect to the optical axis in the direction of a primary beam from a source of charged particles towards a specimen. In other words, the term "upstream" indicates a position closer towards the charged particle source and the term "downstream" indicates a position closer towards a target. An intermediate image plane of the first lens is located between the entrance opening and the first lens and an intermediate object plane of the second lens is located between the exit opening and the second lens. It should be understood that it is within the meaning of the expression "between an opening and a lens" that the intermediate image plane of the first lens is located in the entrance opening and that the intermediate object plane of the second lens is located in the exit opening of the Wien filter. Moreover, for the purpose of the present application it is even within the meaning of the term "between an opening and a lens" that the intermediate image plane and the intermediate object plane are located slightly within the Wien filter. Accordingly, the intermediate image and object planes of the first and second lenses can be located inside the Wien filter, exactly in the entrance or exit openings of the Wien filter or at any point within the range from the openings to the lenses. Furthermore, the Wien filter is adapted for dispersion-free imaging of a first stigmatic image formed in the intermediate image plane of the first lens into a stigmatic image formed in the intermediate object plane of the second lens.

The above described imaging apparatus is adapted for operating high beam currents. The combined action of the dipole Wien filter elements and the 2*m-pole element results in a virtually rotational symmetric, dispersion-free Gaussian imaging. Thus, the stigmatic image created in the intermediate image plane of the first lens is imaged to the intermediate object plane of the second lens in a virtually rotational symmetric, dispersion-free manner. In this context, it should be understood that the term "virtually rotational symmetric, dispersion-free Gaussian imaging" means that the combined action of the dipole Wien filter elements and the 2*m-pole element has imaging properties similar to an ideal round lens when viewed from downstream the Wien filter. To achieve these imaging properties, the Wien filter dipole and 2*m-pole elements are adapted for double-focusing, i.e. for focusing the beam in two perpendicular planes along the optical axis. In other words, defining the optical axis as the z-axis, the Wien filter focuses the charged particle beam in the x-z-plane as well as in the y-z-plane at the same z-position. By definition, the x-z-plane is the plane in which dispersion is generated by the dipole fields of the Wien filter. In the x-z-plane, the dispersion gained within the first half of the length of the Wien filter is counterbalanced in the second half of the length of the Wien filter. Thus, the image at the entrance opening is transferred to the exit opening by the Wien filter in a virtually rotational symmetric, dispersion-free manner.

Since the intermediate image plane of the first lens is located between the entrance opening of the Wien filter and the first lens, charged particles within a large aperture angle are allowed to enter the Wien filter. Compared to the aberration compensated monochromator described in EP 03028694.2, much higher beam currents can be transmitted through the imaging apparatus according to the embodiment of the present invention. Accordingly, the beam current is not limited like in the prior art apparatus. Particularly, an image created at or near the entrance opening of the Wien filter is almost point-like and, especially, corresponds to an image of the charged particle source. Therefore, the above described imaging apparatus is adapted for high beam currents so that a high probe current mode for, e.g. EDX or WDX analysis applications or electron beam inspection, can be implemented in a charged particle device using an imaging apparatus according to an embodiment of the present invention.

According to an embodiment of the present invention, the Wien filter is further adapted so that an axial fundamental trajectory is antisymmetric with respect to the center of the Wien filter when viewed in the x-z-plane within the Wien filter. Thus, the dispersion gained within the first half of the Wien filter length will be automatically balanced by the dispersion gained in the second half of the Wien filter length so that dispersion-free imaging is established.

According to another embodiment of the present invention, the Wien filter is further adapted so that an axial fundamental trajectory in the y-z-plane is antisymmetric with respect to the center of the Wien filter when viewed in the y-z-plane within the Wien filter. Although the antisymmetric nature of the trajectory in the y-z-plane is not a necessary feature, an antisymmetric fundamental trajectory in the y-z-plane results in a rotational symmetric optical path.

In a further, embodiment, the antisymmetric fundamental trajectories in the x-z-plane and y-z-plane have only a single crossover within said Wien filter at the center of the Wien filter. At this crossover, an intermediate stigmatic image is formed within the Wien filter. In this embodiment, only minimum excitation of the coils is necessary while realizing a rotational symmetric, optical path.

According to still another embodiment of the present invention, the Wien filter may also be adapted so that the axial fundamental trajectory in the y-z-plane is symmetric with respect to the center of the Wien filter. This is possible because the Wien filter induces no dispersion in the y-z-plane. Accordingly, also a symmetric axial fundamental trajectory may be followed by a charged particle in the y-z-plane since no dispersion compensation is required. In this embodiment, an astigmatic intermediate image is formed at the center of the Wien filter. Since the size of the beam cross section of the astigmatic image is larger than the beam cross section of a stigmatic image, i.e. when the fundamental trajectory in the y-z-plane is antisymmetric, the effects of particle-particle interactions within the Wien filter can be reduced. This is especially useful in a high probe current mode where strong interactions are expected due to the relatively large number of charged particles within a cross section of the beam. Furthermore, the fundamental trajectory in the y-z-plane with the lowest possible order, i.e. without a zero crossing, corresponds to the lowest excitation.

According to another embodiment of the present invention, the dispersion of the charged particle beam vanishes only in the plane of the stigmatic image formed in the intermediate object plane of the second lens. Alternatively, the imaging apparatus may be adapted that the dispersion of the charged particle beam vanishes also in all planes behind the plane of the stigmatic image formed in the intermediate object plane of the second lens.

According to another embodiment of the present invention, the 2*m-pole element is realized as a quadrupole element. The quadrupole element is the simplest implementation of a 2*m-pole, i.e. it has the lowest possible number of parts. Therefore, it requires much less effort in manufacturing of its parts compared to, e.g., a sextupole, octupole, decapole or even higher order 2*m-pole elements.

According to an embodiment of the present invention, a diaphragm or aperture is located between the first lens and the entrance opening of the Wien filter. In a preferred embodiment, the first lens is adapted to focus the charged particle beam in the plane of the diaphragm or aperture, i.e. the intermediate image plane of the first lens essentially coincides with the aperture plane. Thus, the maximum aperture angle is achieved for charged particles to be transmitted through the Wien filter and, consequently, also the maximum beam current can be achieved.

According to another embodiment of the present invention, a second diaphragm or aperture is located between the exit opening of the Wien filter and the second lens. Therein, the intermediate object plane of the second lens essentially coincides with the plane of the second aperture.

According to still a further embodiment of the present invention, the Wien filter is adapted to form $2*n$, $n \geq 1$, additional intermediate stigmatic images within the length of the Wien filter when the fundamental trajectories in the x-z-plane and the y-z-plane are both antisymmetric. If both fundamental trajectories are antisymmetric, stigmatic intermediate images will be formed at the crossovers $Z_1$, $Z_2$, and $Z_3$. With higher excitation, the additional $2*n$ stigmatic intermediate images can be generated. Therein, the first n intermediate stigmatic images are located between the entrance opening and the middle of the Wien filter and n subsequent intermediate stigmatic images are formed between the middle and the exit opening of the Wien filter. However, it should be understood that also in the case of astigmatic intermediate images, i.e. when the fundamental trajectory in the y-z-plane is symmetric, the number of intermediate images can be varied by adjusting the excitation. Furthermore, the number of intermediate images can also be varied if the symmetry of the fundamental trajectory in the y-z-plane changes, e.g. from antisymmetric to symmetric. In this case, a single intermediate image appears or disappears. However, when the symmetry of the fundamental trajectory in the y-z-plane changes the intermediate images may become astigmatic or stigmatic depending on whether the fundamental trajectory becomes symmetric or antisymmetric, respectively.

According to another aspect of the present invention, a charged particle apparatus comprising a source of charged particles and an imaging apparatus for virtually rotational symmetric, dispersion-free Gaussian imaging is provided. Such a charged particle apparatus is capable of correcting chromatic aberration in the low energy range and simultaneously providing high beam currents which are sufficient for a high probe current mode. For example, EDX or WDX analysis applications or electron beam inspection can thus be implemented.

According to still another aspect of the present invention, a method of operating an imaging apparatus for virtually rotational symmetric, dispersion-free Gaussian imaging is provided. The method includes the steps of creating a stigmatic image essentially in the intermediate image plane of a first lens located upstream the Wien filter, dispersion-free imaging of the stigmatic image essentially into the intermediate object plane of a second lens located downstream the Wien filter, and creating a stigmatic image essentially in the intermediate object plane of the second lens.

When operated according to the above method, an imaging apparatus is capable of virtually rotational symmetric, dispersion-free Gaussian imaging in a high beam current regime. Consequently, this operation method allows for high probe current analysis like EDX or WDX, or efficient electron beam inspection when using the imaging apparatus.

According to still another aspect of the present invention, a method for operating a charged particle apparatus is provided, wherein the operational mode of the charged particle apparatus is switched from a high probe current mode to a monochromator mode or vice versa.

This aspect of the present invention allows to operate a charged particle apparatus in the high probe current mode where large beam currents are used to analyze the sample material and, then, to switch to a monochromator inspection mode where the energy width of the charged particle beam is reduced by the Wien filter/2*m-pole element so that resolution is enhanced due to the reduction of chromatic aberration. It should be understood that the high probe current mode can also be characterized as a dispersion-free mode and that the monochromator mode can also be characterized as a high-dispersion mode. Accordingly, the charged particle apparatus can be operated to switch between a dispersion-free mode and a high-dispersion mode. The switching between these different inspection modes can be easily accomplished by adjusting the lenses and the Wien filter/2*m-pole element, typically by controlling their energizing currents and voltages. The switching between the operational modes of the, charged particle apparatus may be performed manually or automatically. In the latter case, the adjustment of the individual components may be controlled by a computer or similar means.

BRIEF DESCRIPTION OF THE DRAWINGS

Some of the above indicated and other more detailed aspects of the invention will be described in the following description and partially illustrated with reference to the figures. Therein.

DETAILED DESCRIPTION OF THE DRAWINGS

Without limiting the scope of protection of the present application, in the following the charged particle beam device or components thereof will exemplarily be referred to as an electron beam device or components thereof. Thereby, the electron beam might especially be utilized for inspection or lithography. The present invention can still be applied for apparatuses and components using other sources of charged particles and/or other secondary and/or backscattered charged particles to obtain a specimen image.

Furthermore, without limiting the scope of protection of the present application most embodiments refer to a quadrupole element as a realization of the 2*m-pole element. However, it should be understood that it is neither a necessary nor desirable for every application that the 2*m-pole element is a quadrupole element. Rather, also the application of octupole elements, duodecapole elements, or, in general, 2*m-pole elements is within the scope of the present application. For example, it should be understood by a skilled person that a duodecapole element may be chosen if independent superposition of a hexapole field is required for a specific application.

Those skilled in the art would also appreciate that all discussions herein related to e.g. an x-z- or an y-z-plane are to be understood that the planes are essentially perpendicular to each other. Even though theoretical discussions in this application refer to coordinates in a mathematical sense, the respective components can practically be positioned with respect to each other so that the x-z- and y-z-plane enclose an angle of about 80° to 100°, preferably 87° to 93°, more preferably of about 89° to 91°. It should be further mentioned that, by definition, the x-z-plane is the plane in which dispersion is generated by the Wien filter dipole fields and that the y-z-plane is dispersion-free with respect to the Wien filter dipole fields.

Further, without limiting the scope of protection of the present application, in the following, the charged particle beams will be referred to as primary charged particle beams. The present invention might still be used for secondary and/or backscattered charged particles.

Further, without limiting the scope of protection of the present application, within the present application the beam direction corresponds to the z-axis. Unless otherwise noted, the term "length of a field (region)" or "length of a component" describes the dimension in z-direction.

Further, without limiting the scope of protection of the present application, within the present application the term "essentially" is preferably understood as including a ±5%-tolerance in the z-direction, i.e. along the beam direction.

Within the following description of the drawings the same reference numbers refer to the same components. Generally, only the differences with respect to the individual embodiments are described.

Figure 7A:
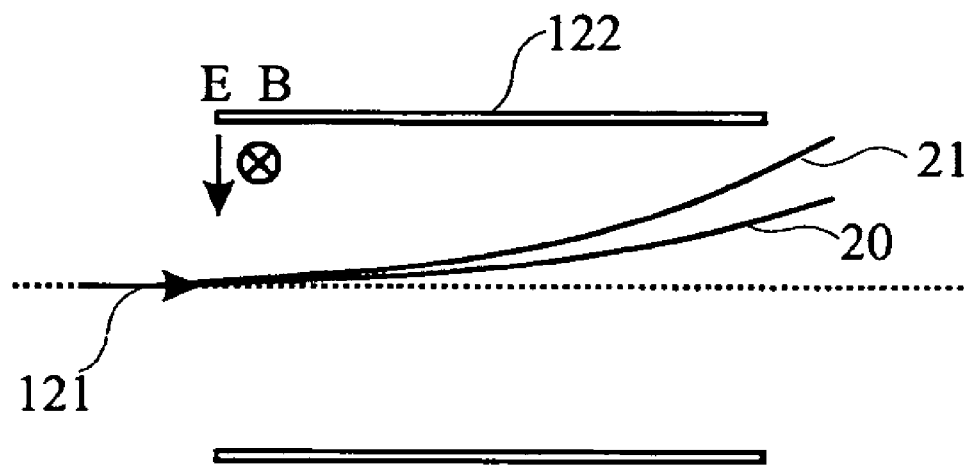
FIGS. 7a to 8b show schematic side views of Wien filters and excitation conditions.

With reference to FIGS. 7 and 8, some principles of the Wien filter will now be described. FIG. 7a shows a Wien filter element 122 and its influence on a charged particle 121. The dipole Wien filter generates an electrostatic field E and a magnetic field B. The fields are perpendicular with respect to each other. The charged particle, which is indicated by arrow 121, has a non-nominal energy. Only charged particles with the nominal energy would be allowed to pass straight through the Wien filter. Thus, the charged particle 121 is deflected from the optical axis. This results in a charged particle beam 20.

Figure 7B:
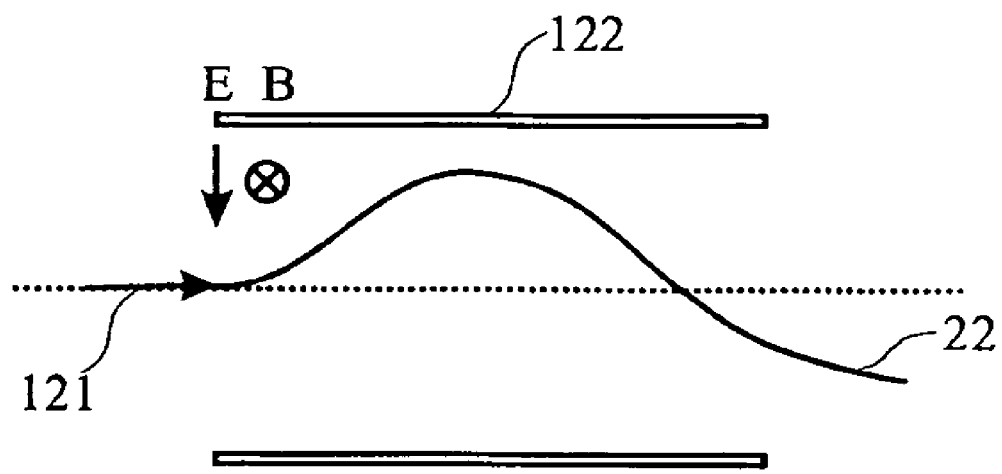

A diagram like the one shown in FIG. 7a can be found in many textbooks. In practice, it is relevant to further increase the excitation of the Wien filter. An example therefor is shown in FIGS. 7a and 7b. Starting to increase the excitation, the excitation leads to an increased deflection angle, as indicated by charged particle beam 21. However, if the excitation of Wien filter 122 is further increased the charged particle beam reaches a limiting deflection angle. A further increase diminishes the deflection angle (see FIG. 7b). The charged particle is deflected back towards the optical axis. Thus, even though the excitation is increased, the deflection angle is not increased beyond a-certain limit.

Figure 8A:
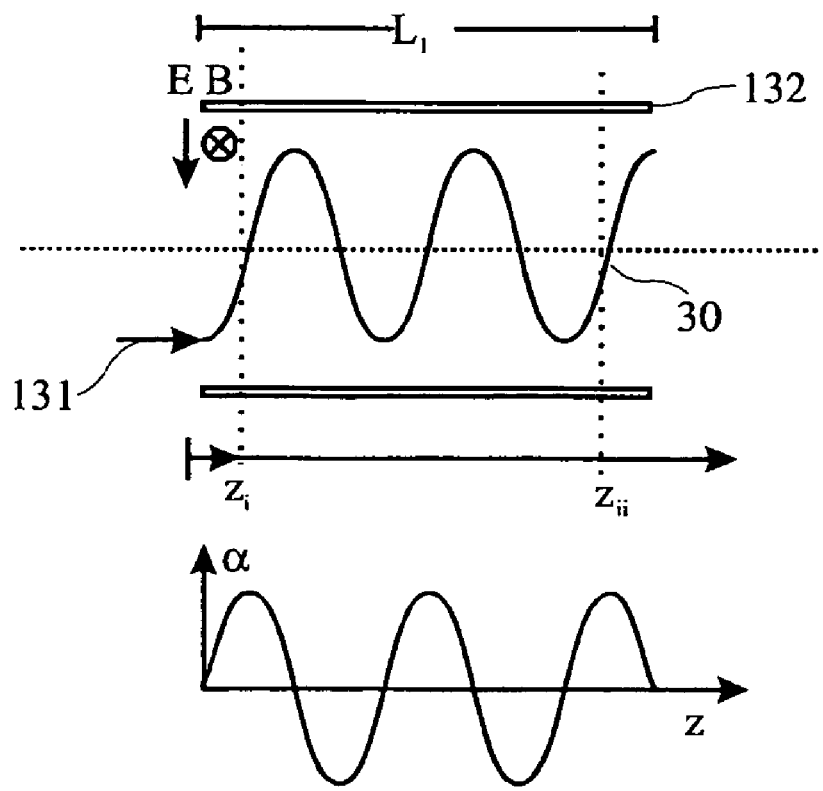

This might be better understood with reference to FIG. 8a. FIG. 8a shows in its upper part a Wien filter 132 having a length $L_1$ along the optical axis (z-axis). An incoming charged particle 131 is imaged due to the electrostatic field and magnetic field. The Wien filter has, additionally to its dispersive properties, imaging properties. The diagram in the lower part of FIG. 8a shows the deflection angle versus the z-position. For position $z_i$ and position $z_{ii}$ the angles are approximately similar. Thus, not the entire excitation could be used to have an increased separation between charged particles of different energy.

Figure 8B:
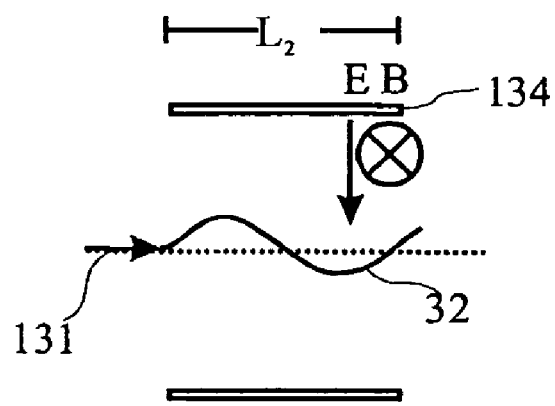

The term excitation might be better understood when comparing FIG. 8a and 8b. The Wien filter of FIG. 8b has a length $L_2$ which is shorter than length $L_1$ of the Wien filter shown in FIG. 8a. However, the beam path 32 is comparable to the beam path 30. This is realized by having higher field strengths of the electrostatic and magnetic fields within Wien filter 134, which is indicated by the larger field symbols. The excitation can be considered to be the product from the length of the Wien filter and the field strengths.

Now, an imaging apparatus according to an embodiment of the present invention is described with reference to FIG. 1. In the embodiment shown in FIG. 1, a first lens 1 is disposed upstream a Wien filter 2. Typically, the first lens 1 is a round lens. An intermediate image plane $Z_1$ of the first lens 1 is essentially located in the range from the plane of a first opening 6 of the Wien filter 2 to the plane of a first aperture 4. The first aperture 4 with an opening width $W_1$ is located between the first lens 1 and the Wien filter 2 at a position proximate to the first opening 6 of the Wien filter. A second aperture 5 with an opening width $W_2$ is disposed between a second opening 7 of the Wien filter and a second lens 3. Typically, the opening widths $W_1$ and $W_2$ are in the range of 1 μm to 15 μm, typically 5 μm to 10 μm, wherein 10 μm is a very typical value. Typically, the opening widths of the first and second apertures 4, 5 are chosen so that the imaging apparatus can be operated both in a high probe current mode and a monochromator mode. Typically, also second lens 3 is a round lens. An intermediate object plane of the second lens is essentially located in the range from the plane of the second opening 7 of the Wien filter 2 to the plane of the second aperture 5. Since the whole arrangement is typically symmetric with respect to the center of the Wien filter, the opening widths of the first and second apertures 4, 5 are typically the same.

Figure 2A:
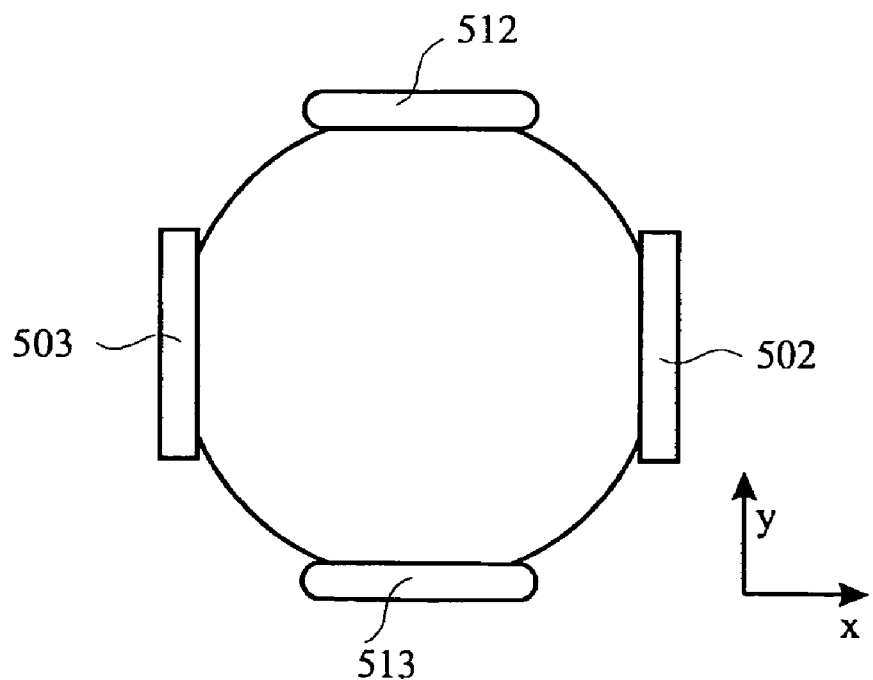
FIGS. 2a to 2d show various embodiments of a Wien filter with a 2*m-pole element according to the present invention.

Next, the configuration of the Wien filter is described. FIGS. 2a to 2d show different embodiments of the Wien filter dipole elements as well as the Wien filter dipole elements and the 2*m-pole element. The views are in direction of the z-axis. In FIG. 2a there are electrostatic poles 502 and 503. These poles are used to generate an electric field in x-direction. Magnetic poles 512 and 513, which are generally excited by coils, are used to generate a magnetic field in y-direction. The poles 502, 503, 512 and 513 form a dipole Wien filter element.

Figure 2B:
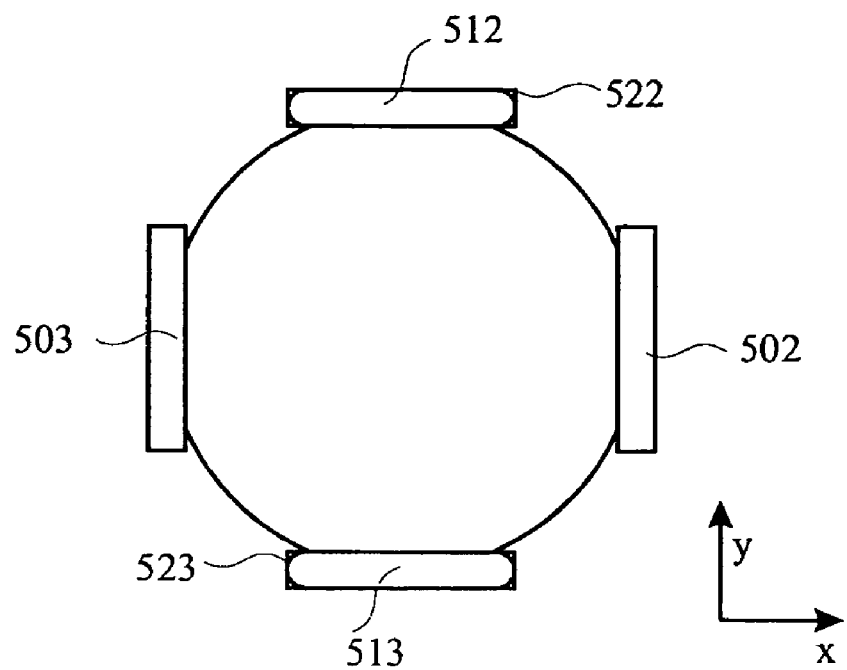

The embodiment of FIG. 2b comprises the elements of the Wien filter described above. Additionally, electrostatic poles 522 and 523 are provided. These electrostatic poles 522 and 523 form together with electrostatic poles 502 and 503 an electrostatic quadrupole, which can be used as a focusing and quasi-non-dispersive element. Within the embodiment of FIG. 2b, the Wien filter element and the quadrupole element share poles. Thus, these two elements are provided as one component.

In an alternative embodiment (not shown) the electrostatic poles of the Wien filter element and the electrostatic poles of the electrostatic quadrupole element can be separated. In such a case, the Wien filter element and the electrostatic quadrupole element would be considered as two separate components. A possible separation of the poles for the Wien filter element and the quadrupole element can be more easily understood with reference to FIG. 2c.

Figure 2C:
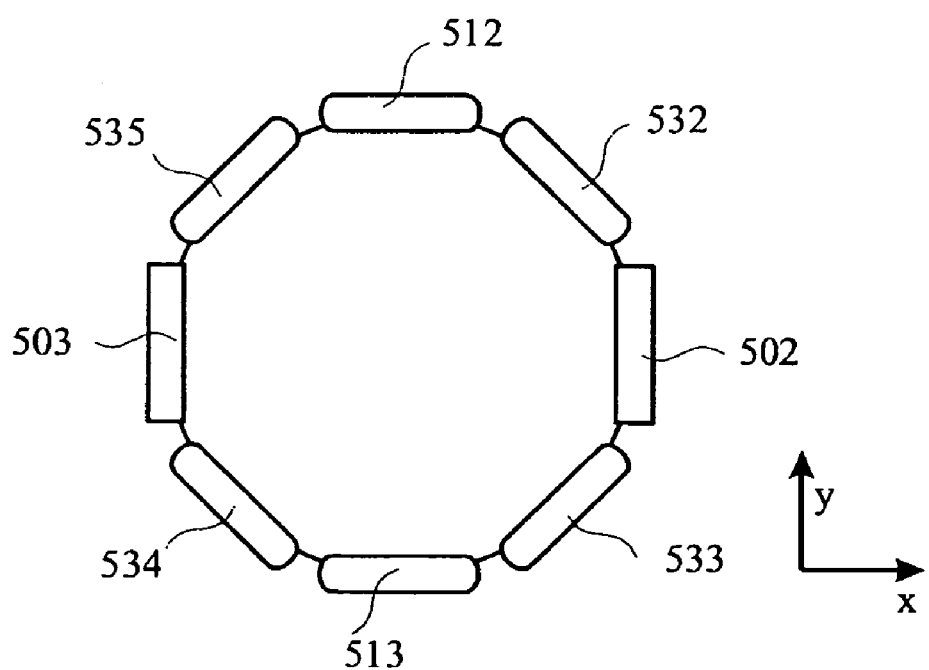

FIG. 2c shows an embodiment with a dipole Wien filter element (502, 503, 512, 513) and a magnetic quadrupole 532 to 535. In order to generate a focusing in x-direction and a defocusing in y-direction with the magnetic quadrupole element, the poles of the magnetic quadrupole are rotated by 45° as compared to the poles of the Wien filter element. In the case of FIG. 2c, two possibilities can be realized; namely to provide one multipole including the Wien filter element and the quadrupole element or to provide two components.

Figure 2D:
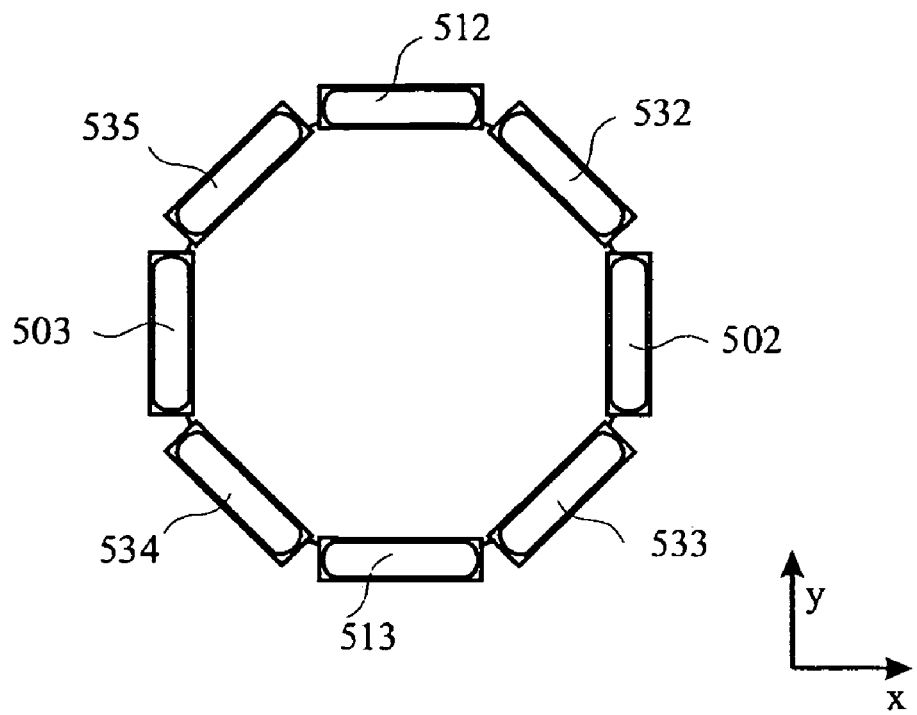

FIG. 2d shows an illustration of an embodiment for a combined electrostatic magnetic multipole. Thereby, two electrostatic and two magnetic poles form a dipole Wien filter. Further, an electrostatic and/or magnetic quadrupole field can be generated. Additionally, higher order multipole fields, e.g. octupole fields, can be generated in order to compensate for aberrations introduced during any imaging of the electron beam on a specimen.

With reference to FIGS. 2a to 2d, different embodiments and individual details of a Wien filter element with a 2*m-pole element and combinations thereof have been disclosed in general. Unless mutually exclusive, the described details can be combined with each other, independent of the specific embodiments. Furthermore, it should be understood that quadrupole and octupole elements described above are only examples for a 2*m-pole element. It is also within the scope of the present invention to apply 2*m-poles of higher order, e.g. 12-poles or 16-poles.

Next, the operation and action of the combined Wien filter/quadrupole element 2 according to an embodiment of the present invention is described with reference to FIGS. 1 and 3a to 3d.

Figure 1:
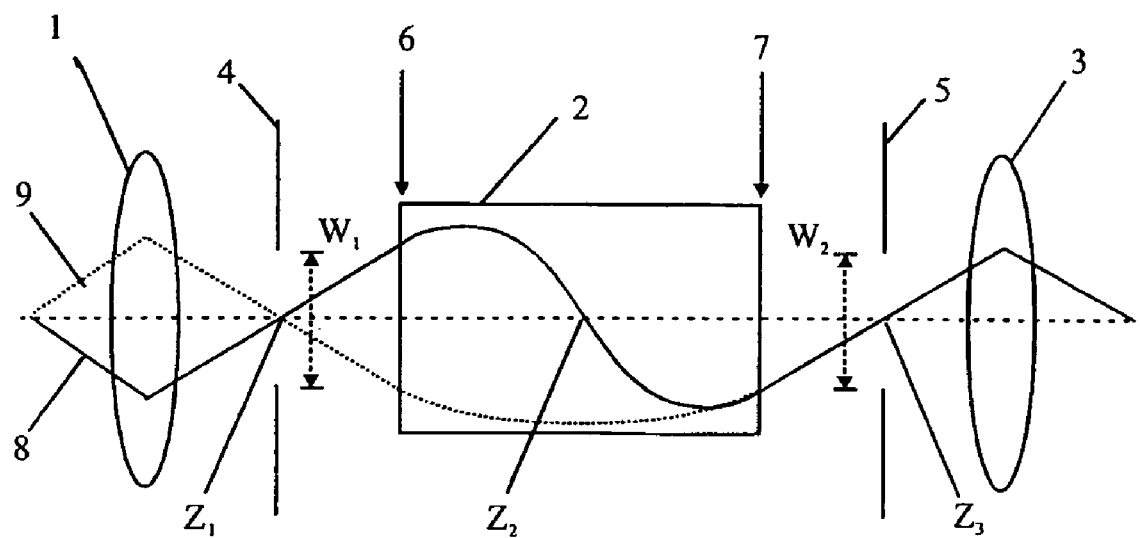
FIG. 1 is a schematic view of an imaging apparatus according to an embodiment of the present invention.

In FIG. 1, the full line shows an axial fundamental trajectory 8 of the system in the x-z-plane and the broken line shows an axial fundamental trajectory 9 of the system in the y-z-plane. A first stigmatic image is created at point $Z_1$ in the intermediate image plane of first lens 1. In the embodiment shown in FIG. 1 this intermediate image plane essentially coincides with the plane of the first aperture 4. Therefore, charged particles coming from a large aperture angle may enter the opening of the first aperture 4. As a result, a very high beam current is transmitted through first aperture 4. However, it should be understood that the intermediate image plane of first lens 1 may be located at any position on the optical axis ranging from first lens 1 to the entrance opening 6 of Wien filter 2. It may even be located inside the Wien filter 2. The intermediate stigmatic image at $Z_1$ is imaged to an intermediate stigmatic image in an intermediate object plane $Z_3$ of second lens 3. In the embodiment shown in FIG. 1, the position $Z_3$ is within the opening of the second aperture 5. However, it may be located at any position on the optical axis ranging from the exit opening 7 of Wien filter 2 to the second lens 3. It may even be located inside the Wien filter 2. In this embodiment, the intermediate image plane $Z_1$ and the intermediate object plane $Z_3$ are located outside the Wien filter 2 and are spaced from the center $Z_2$ of the Wien filter by the same distance. Thus, it is possible to focus the charged particle beam within the first aperture 4 and obtain a maximum probe current.

As described above, the location of crossover at $Z_1$ with respect to first aperture 4 can be relatively freely chosen. The distance on the optical axis between the crossover at $Z_1$ and the aperture opening determines the amount of beam current entering the Wien filter 2. Thus, it is possible to continuously adjust the probe current by varying the position $Z_1$ of the crossover with respect to the first aperture 4. Within certain limits, the probe current may thus be adjusted for specific applications.

The fundamental trajectory 8 in the x-z-plane (full line) is antisymmetric with respect to the center plane of the Wien filter. Thus, the dispersion gained within the first half of Wien filter 2 is compensated in the second half of the Wien filter. The fundamental trajectory 9 in the y-z-plane (broken line) is symmetric with respect to the center of the Wien filter and, therefore, coincides with the antisymmetric fundamental trajectory 8 downstream Wien filter 2. Since the Wien filter induces no dispersion in the y-direction, it is not necessary for the fundamental trajectory in the y-z-plane to be antisymmetric. As can be seen from FIG. 1, an astigmatic image $Z_2$ is created at the center of the Wien filter. Thus, particle interactions within the beam can be reduced within the Wien filter.

Figure 3A:
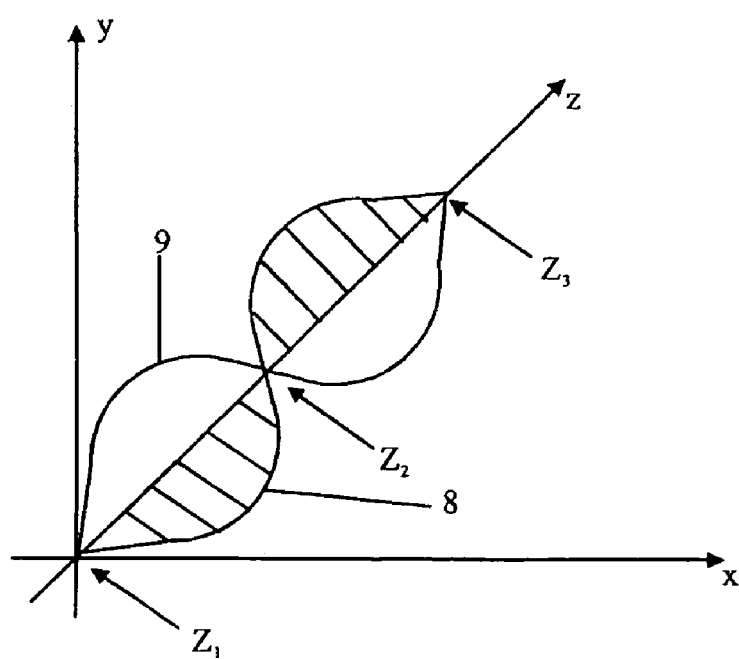
FIG. 3a is a schematic diagram of particle trajectories according to an embodiment of the present invention.

However, the fundamental trajectory 9 can also be chosen to be antisymmetric like the fundamental trajectory 8 in the x-z-plane as will be explained with reference to FIG. 3a. FIG. 3a shows fundamental electron trajectories. A first fundamental electron trajectory 8 is located in the x-z-plane and a second fundamental electron trajectory 9 is located in the y-z-plane. The area enclosed by the first fundamental trajectory 8 is hatched to facilitate distinction of both fundamental trajectories. The fundamental trajectories 8, 9 start from a common point $Z_1$ on the z-axis. This point $Z_1$ corresponds to the image created by the first lens 1 in the plane of, e.g., the entrance opening of the Wien filter 2 or the first aperture 4. It should be understood that this image is not necessarily point-like, e.g. in a case where the first lens focuses the electron beam in the plane of an aperture. Both fundamental trajectories 8, 9 have a sine-like shape and form two subsequent crossovers at $Z_2$ and $Z_3$. One of these crossovers $Z_3$ is located essentially in the intermediate object plane of the second lens 3, e.g. in the plane of the exit opening of the Wien filter 2 or of the second aperture 5. The other crossover $Z_2$ is located essentially halfway the length of the Wien filter 2, i.e. essentially in a center plane of the Wien filter 2. Thus, a stigmatic image is formed at the downstream end of the Wien filter 2 and an intermediate stigmatic image is formed at the center of the Wien filter 2. Because the fundamental trajectory 8 in the x-z-plane is point-symmetric, i.e. antisymmetric, with respect to the center of the Wien filter 2, the dispersion gained due to the action of the dipole fields in the first half of the Wien filter 2 is counterbalanced by the action of the dipole fields in the second half of the Wien filter 2. Also, fundamental trajectory 9 in the y-z-plane is point-symmetric with respect to the center of the Wien filter in this embodiment although this is not necessary as will be explained below. Thus, the Wien filter/quadrupole 2 provides rotational symmetric, dispersion-free imaging of the point-like image generated by the first lens 1.

Figure 3B:
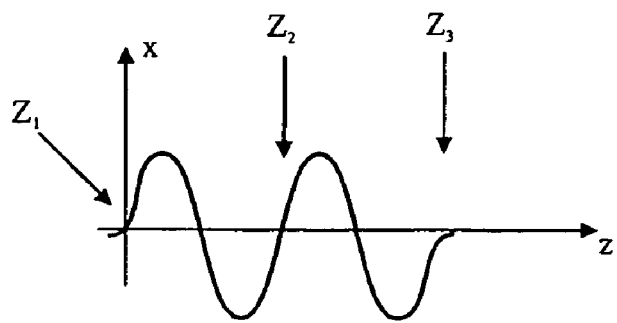
FIG. 3b shows a particle trajectory in the x-z-plane.
Figure 3C:
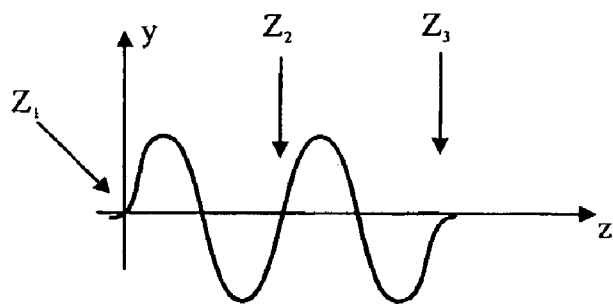
FIG. 3c shows a particle trajectory in the y-z-plane.

FIGS. 3b and 3c show exemplary cross-sectional views of the fundamental particle trajectories according to a further embodiment of the present invention. FIG. 3a shows a cross-sectional view in the x-z-plane. The fundamental trajectory is sine-like and crosses the z-axis not only at $Z_2$ and $Z_3$ but also at two further intermediate crossovers, one thereof being located between $Z_1$ and $Z_2$, e.g. between the entrance and the middle of the Wien filter, and the other one being located between $Z_2$ and $Z_3$. FIG. 3b shows a similar fundamental trajectory in the y-z-plane. Likewise, this fundamental trajectory in the y-z-plane is sine-like and has two further intermediate crossovers, one thereof being located upstream $Z_2$, i.e. between $Z_1$ and the middle of the Wien filter, and the other one being located between $Z_2$ and $Z_3$. Thus, at each of the intermediate crossovers, intermediate stigmatic images are created.

Figure 3D:
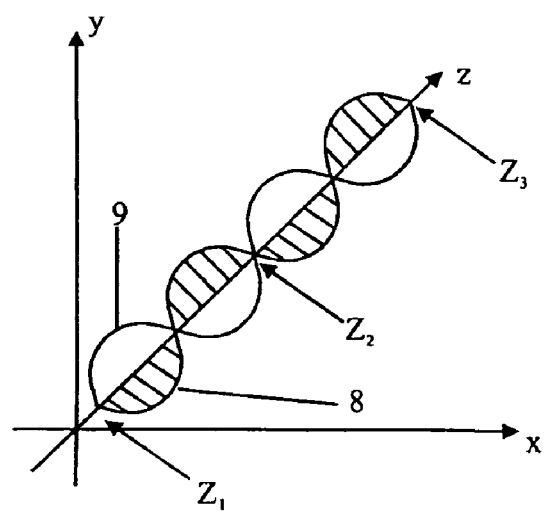
FIG. 3d is a schematic diagram of particle trajectories inside the Wien filter according to a further embodiment of the present invention.

FIG. 3d shows the combination of the individual fundamental trajectories 8, 9 shown in FIGS. 3b and 3c. Like in FIG. 3a, the area enclosed by the first fundamental trajectory 8 in the x-z-plane is hatched to facilitate distinction of both trajectories. Although only two additional crossovers are shown in FIG. 3d, is should be understood that, in general, Wien filter 2 can be adapted to form 2*n additional intermediate stigmatic images, wherein n is a positive integer larger or equal to one. In this case n intermediate stigmatic images are formed between the image formed by the first lens at $Z_1$ and the crossover at $Z_2$ and the other n intermediate stigmatic images are formed between the crossovers at $Z_2$ and $Z_3$.

Figure 3E:
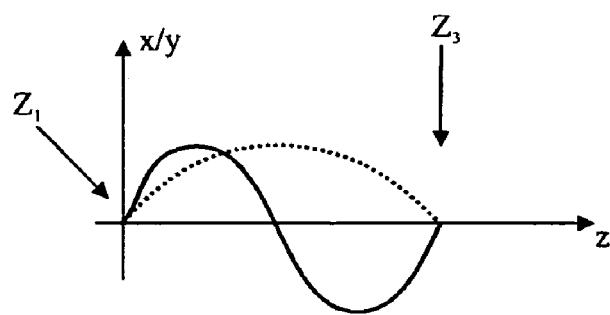
FIG. 3e shows an antisymmetric particle trajectory in the x-z-plane (full line) and a symmetric particle trajectory in the y-z-plane (dotted line).

FIG. 3e shows a different embodiment of the present invention. Since the dipole fields of the Wien filter do not induce any dispersion in the y-z-plane, it is not mandatory that the charged particles follow an antisymmetric path in the y-z-plane. In FIG. 3e, the antisymmetric fundamental trajectory in the x-z-plane is shown as a full line and the fundamental trajectory in the y-z-plane is shown as a broken line. As can be seen from FIG. 3e, the fundamental trajectory in the y-z-plane is symmetric with respect to the center of the Wien filter. Therefore, no intermediate stigmatic images are created in this case. Especially, there is no stigmatic image created at the center plane of the Wien filter. As a result, the cross section of the beam within the Wien filter is relatively large in any cross sectional plane within the Wien filter except, of course, of the image planes at $Z_1$ and $Z_3$. Thus, particle-particle interactions in the beam are reduced compared to a case where stigmatic images are created within the Wien filter.

Furthermore, the fundamental trajectory in the y-z-plane (broken line) shown in FIG. 3e is the lowest order symmetric fundamental trajectory of the system. Also, the fundamental trajectory in the x-z-plane (full line) is the lowest order antisymmetric fundamental trajectory. Therefore, the combination of these lowest order fundamental trajectories corresponds to the lowest excitation of the system, i.e. the lowest excitation of the coils.

Figure 3F:
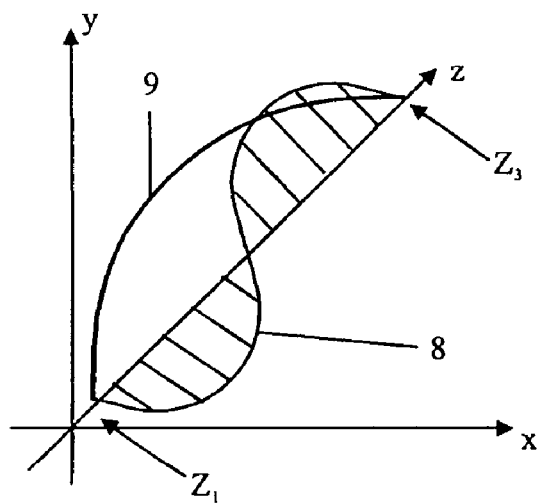
FIG. 3f is a schematic diagram of particle trajectories inside the Wien filter according to another embodiment which is similar to the embodiment shown in FIG. 3e.

FIG. 3f shows the combination of the individual fundamental trajectories 8, 9 shown in FIG. 3e. Like in FIG. 3a, the area enclosed by the first fundamental trajectory 8 in the x-z-plane is hatched to facilitate distinction of both fundamental trajectories. According to this embodiment, no intermediate stigmatic images are formed within the Wien filter. It should further be understood that not only a symmetric or antisymmetric path may be independently chosen for the y-z-plane but that also the numbers of crossings of the optical axis (z-axis) are independent for paths in the x-z-plane and the y-z-plane. This is explained with reference to FIGS. 3g and 3h.

Figure 3G:
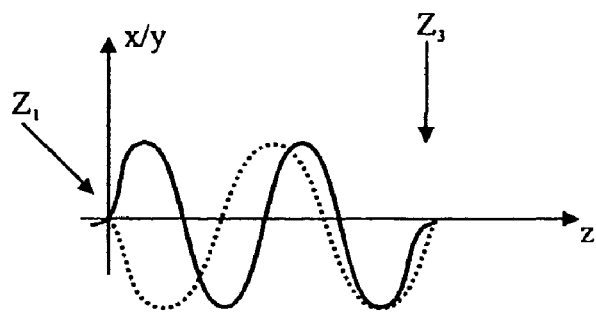
FIG. 3g shows a particle trajectory in the x-z-plane (full line) and in the y-z-plane (dotted line) according to a further embodiment of the present invention.
Figure 3H:
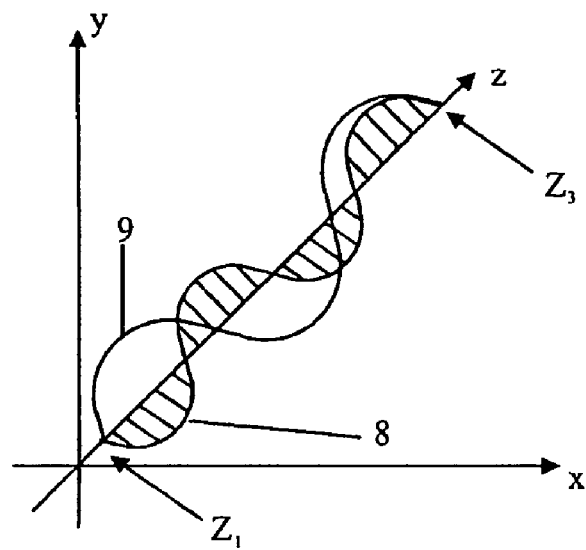
FIG. 3h is a schematic diagram of particle trajectories inside the Wien filter according to still another embodiment which is similar to the embodiment shown in FIG. 3g.

FIG. 3g corresponds to FIG. 3e but shows fundamental trajectories of higher order corresponding to higher excitations of the Wien filter. Namely, the antisymmetric fundamental trajectory in the x-z-plane crosses the optical axis five times and the symmetric fundamental trajectory in the y-z-plane crosses the optical axis four times within the Wien filter. It should also be understood that the number of crossings of the optical axis is unrelated to whether both fundamental trajectories are antisymmetric or the fundamental trajectory in the y-z-plane being symmetric. Similar to FIG. 3f, FIG. 3h shows the combination of the individual fundamental trajectories 8, 9 shown in FIG. 3g.

Figure 4:
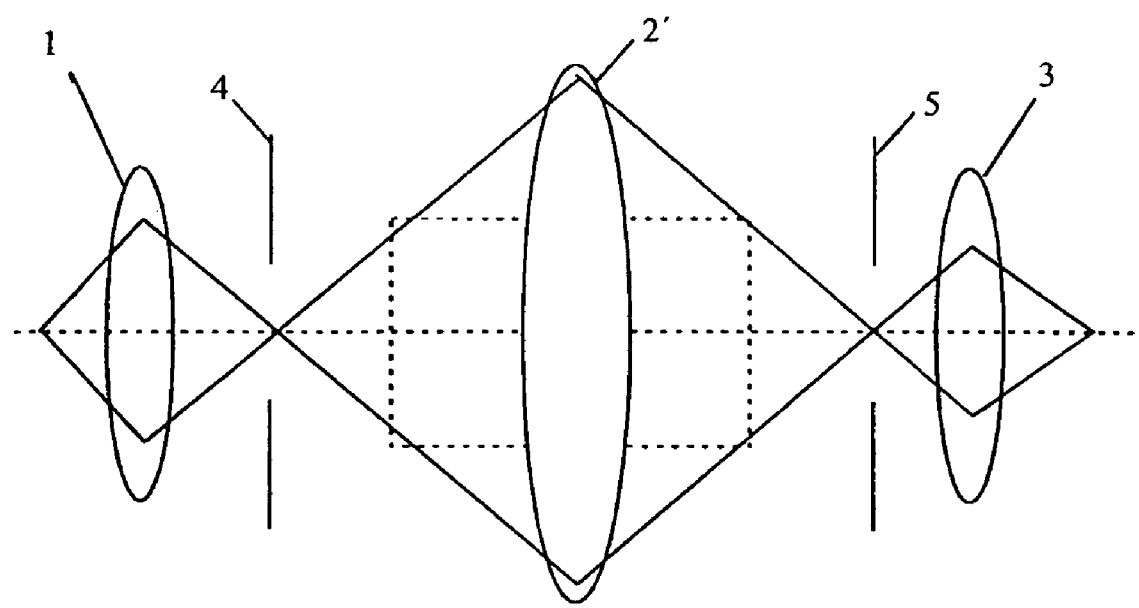
FIG. 4 illustrates the imaging properties of the Wien filter.

FIG. 4 exemplifies the action of the Wien filter comprising a 2*m-pole element, m≧2, according to embodiments of the present invention. Like in FIG. 1, a first lens 1, a second lens 3, and first and second aperture means 4, 5 are shown. However, the Wien filter is only shown by broken lines. Instead, a round lens 2' is shown at the center of the Wien filter. This round lens 2' is only an idealization of the action of the Wien filter. As has been described above, the Wien filter/2*m-pole element provides a virtually rotational symmetric, dispersion-free imaging which can be imagined as the action of an ideal round lens 2'. Therefore, the arrangement shown in FIG. 4 may be considered as an equivalent optical system for the arrangement shown in FIG. 1.

Embodiments of electron beam columns utilizing an imaging apparatus according to an embodiment of the present invention are described in FIGS. 5 and 6. Therein, FIGS. 5a to 5d show the electron beam column in a first mode of operation which is a high probe current mode. For example, EDX or WDX analysis of the sample material or an electron beam inspection can be conducted in such a high probe current mode. FIGS. 6a to 6d show the electron beam column in a second mode of operation in which the Wien filter/quadrupole element is operated as a monochromator so that enhanced resolution due to chromatic aberration reduction is achieved. Both embodiments comprise an electron beam column 10 wherein an electron beam is emitted by emitter 15. The column comprises a housing 11 and the specimen chamber 12 which can both be evacuated. The electron beam traveling substantially along the optical axis 14 impinges on specimen 13.

Within FIG. 5a, the emitted electrons that are accelerated by anode lens 16 and form a first crossover below the anode lens. A first lens 1 forms a crossover of the electron beam at the entrance opening of a Wien filter/quadrupole element 2. A portion of the electron beam is blocked by electron selection element 4 before entering the Wien filter 2. Thereby, a defined beam shape is generated. The excitation of first lens 1 is chosen so that its back intermediate image plane essentially coincides with the plane of the upstream opening of the Wien filter 2 so that the generated crossover is located in the entrance opening of the Wien filter/quadrupole element 2. Due to its double focusing property, the Wien filter 2 provides a dispersion-free, virtually rotational symmetric image of this crossover at its exit opening. Objective lens 3 is then used to focus the electron beam on the specimen. The excitation of objective lens 3 is chosen so that its front intermediate object plane essentially coincides with the plane of the downstream opening of the Wien filter 2 so that the second or objective lens 3 images the very concentrated stigmatic image onto the specimen 13. Independent of specific embodiments, the imaging apparatus 2 comprises a dipole Wien filter and a quadrupole element. Further independent of specific embodiments, separate components for generating the Wien filter fields and the quadrupole field can be provided or, alternatively, a single component for generating these fields can be provided.

Figure 5A:
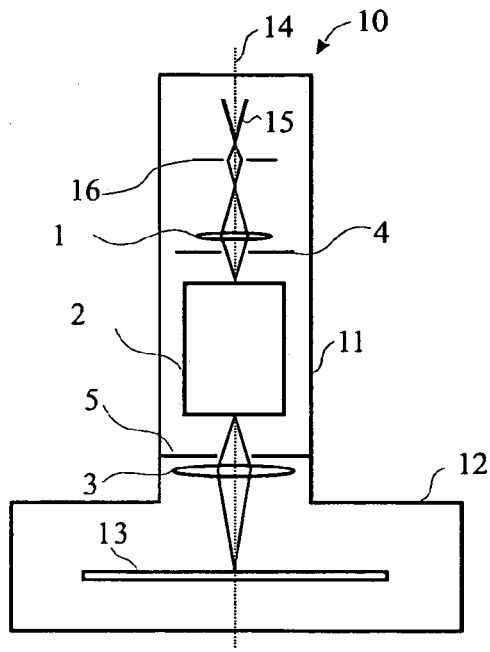
FIG. 5a is a schematic view of a charged particle beam apparatus according to an embodiment of the present invention when being operated in a first mode.
Figure 5B:
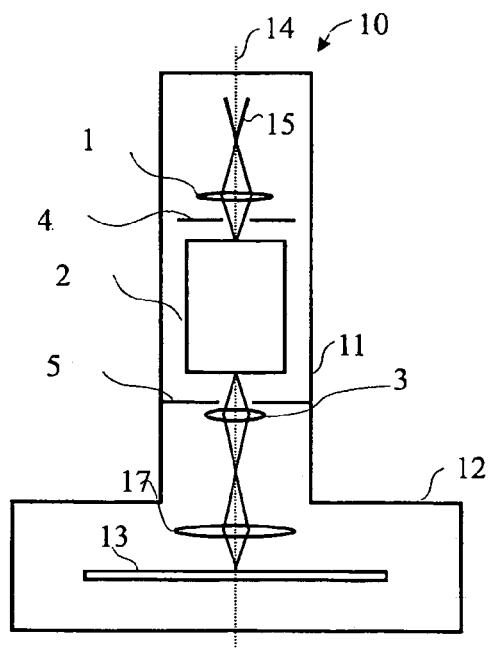
FIG. 5b is a schematic view of a charged particle beam apparatus according to another embodiment of the present invention when being operated in a first mode.

The embodiment shown in FIG. 5b has a first lens 1 above the imaging apparatus 2, a second lens 3, and an objective lens 17. FIG. 5b shows electron selection element or aperture means 4 and 5 which are directly neighboring the imaging apparatus 2. The electron selection element 4, which is positioned upstream the imaging apparatus 2, is an electron angle dependent selection element. Compared to the embodiment of FIG. 5a, the embodiment shown in FIG. 5b provides more flexibility since second lens 3 can be optimized for imaging the stigmatic image at $Z_3$ whereas objective lens 17 can be optimized for focusing this stigmatic image onto specimen 13.

Figure 5C:
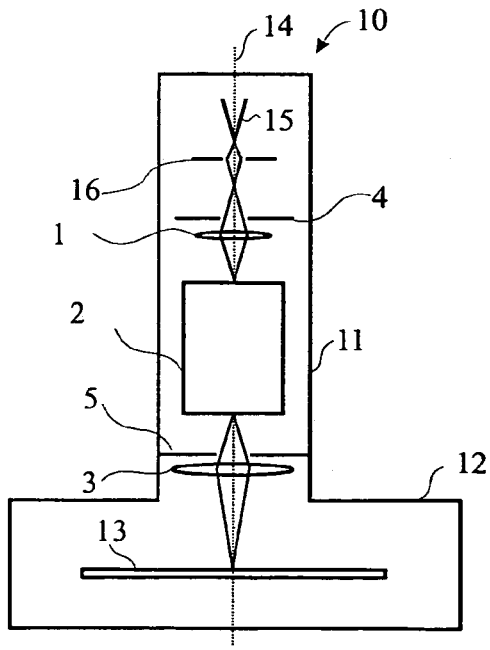
FIG. 5c is a schematic view of a charged particle beam apparatus according to a further embodiment of the present invention when being operated in a first mode.

FIG. 5c shows an embodiment corresponding to the embodiment shown in FIG. 5a. However, in the embodiment shown in FIG. 5c, the first aperture means 4 is located upstream the first lens 1. Thus, the angle from which charged particles are transmitted through the Wien filter/quadrupole element 2 is selected prior focusing the beam onto the entrance opening of the Wien filter.

Figure 5D:
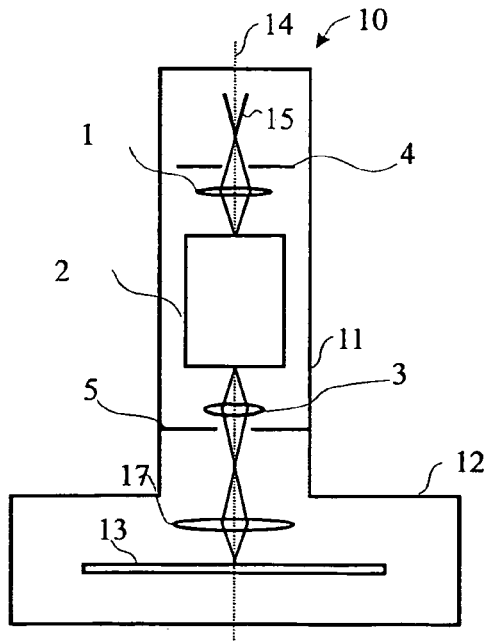
FIG. 5d is a schematic view of a charged particle beam apparatus according to still a further embodiment of the present invention when being operated in a first mode.
Figure 6A:
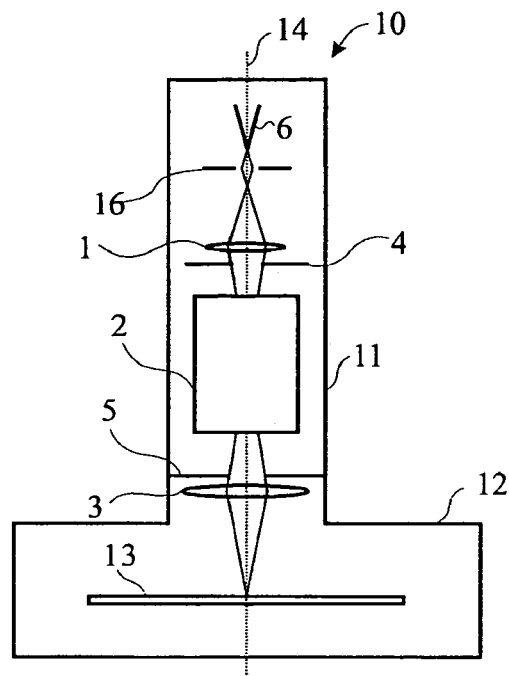
FIG. 6a is a schematic view of a charged particle beam apparatus according to an embodiment of the present invention when being operated in a second mode.
Figure 6B:
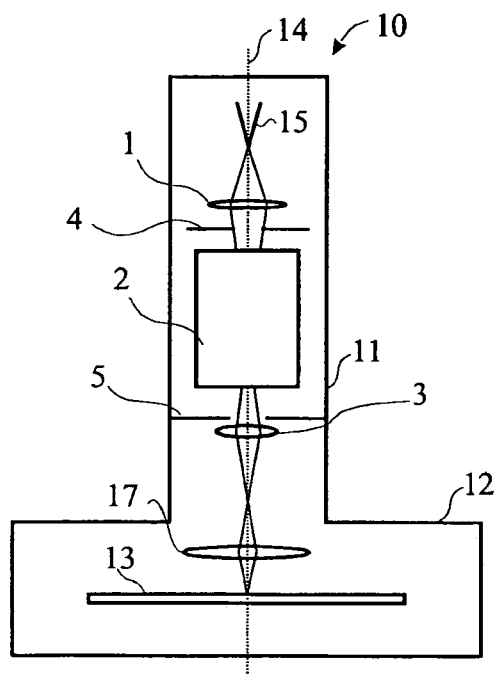
FIG. 6b is a schematic view of a charged particle beam apparatus according to another embodiment of the present invention when being operated in a second mode.
Figure 6C:
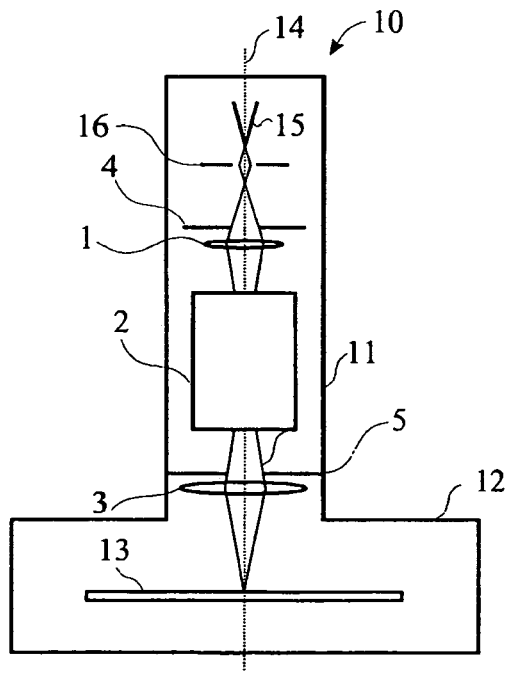
FIG. 6c is a schematic view of a charged particle beam apparatus according to a further embodiment of the present invention when being operated in a second mode.
Figure 6D:
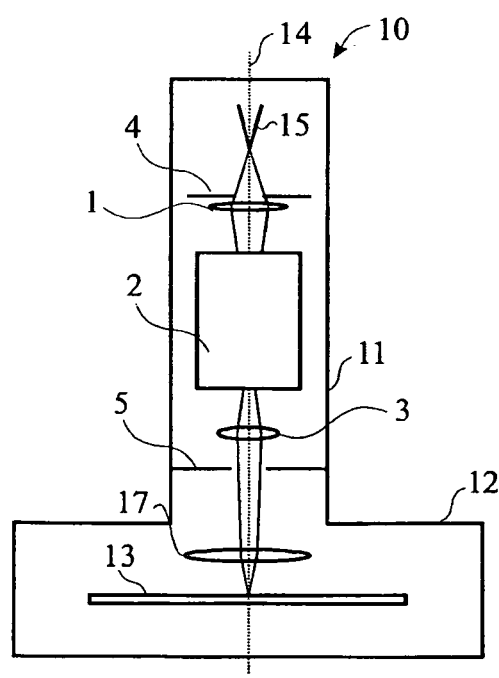
FIG. 6d is a schematic view of a charged particle beam apparatus according to still a further embodiment of the present invention when being operated in a second mode.

Similarly, the embodiment shown in FIG. 5d corresponds to the embodiment shown in FIG. 5b but the first aperture means 4 is located upstream the first lens 1. Furthermore, the second aperture means 5 is located downstream the second lens 5.

It should be understood that the above embodiments are only exemplary and that various features can be exchanged between as long as the virtually rotational symmetric, dispersion-free imaging is still provided. For example, the anode lens 16 can also be applied to the embodiment shown in FIG. 5b. Furthermore, in the high probe current operation mode, the second aperture means 5 is only an electron angle selection element and not an electron energy selection element since the imaging by Wien filter 2 is dispersion-free. Therefore, the second aperture means 5 may be omitted for the purposes of this mode.

FIGS. 6a to 6d correspond to FIGS. 5a to 5d, respectively, and have the same configuration so that a detailed description thereof is omitted. FIGS. 6a to 6d show the embodiments of FIGS. 5a to 5d in an operational mode in which the first lens 1, the Wien filter/quadrupole element 2, and the second lens 3 are adapted so that the Wien filter/quadrupole element 2 acts as a monochromator. Especially, the first lens 1 focuses the electron beam to the center of the Wien filter. In the x-z-plane, the Wien filter/quadrupole is dispersive and, in Gaussian approximation, force-free for particles of nominal energy. In the y-z-plane, the Wien filter/quadrupole is focusing. Second aperture means 5 serves as an electron energy selection element. Thus, the energy width of the electron beam is reduced and, consequently, also chromatic aberration is reduced. As a result, better resolution is achieved. For the details of the operation of the Wien filter/2*m-pole element as a monochromator, the full disclosure of EP 03028694.2 (Frosien et al.) is hereby incorporated by reference.

In an electron beam apparatus according to any of the above described embodiments, high probe current analysis as well as high resolution inspection of specimen 13 is possible since an operator can switch between these operational modes. In the high probe current mode, sufficiently high beam currents can be provided at the specimen 13 for, e.g., EDX or WDX analysis or electron beam inspection. On the other hand, a high resolution imaging mode can also be realized in the above apparatus. Especially, the switching between these two modes may be realized without substantial changes to the electron beam apparatus. For example, the switching may be realized by software controlled adjustment of the energizing currents of the electrostatic and magnetic components of the lenses and the Wien filter/quadrupole element. Furthermore, the beam current may be continuously adjusted in such an electron beam apparatus. Typically, the closer the intermediate image planes $Z_1$ and $Z_2$ are located to the aperture planes 4 and 5, the higher the beam current can be chosen. Thus, an electron beam apparatus for various tasks is provided which is flexibly applicable.

The invention claimed is:

1. An imaging apparatus, comprising
a first lens;
a Wien filter having a first opening and a second opening, and further comprising a 2*m-pole element, wherein, m≧2;
a second lens;
wherein said first lens is disposed upstream of said first opening of the Wien filter and said second lens is disposed downstream of said second opening of the Wien filter, and an intermediate image plane of the first lens is located between said first opening and said first lens and an intermediate object plane of the second lens is located between said second opening and said second lens; and
wherein said Wien filter is adapted for dispersion-free imaging of a stigmatic image formed in said intermediate image plane of said first lens into a stigmatic image formed in said intermediate object plane of said second lens.

2. The apparatus according to claim 1, wherein said Wien filter is further adapted so that, within said Wien filter, an axial fundamental trajectory in the x-z-plane is antisymmetric with respect to the center of the Wien filter.

3. The apparatus according to claim 2, wherein said Wien filter is further adapted so that, within said Wien filter, an axial fundamental trajectory in a y-z-plane is antisymmetric with respect to the center of the Wien filter.

4. The apparatus according to claim 3, wherein an antisymmetric axial fundamental trajectories in the x-z-plane and in the y-z-plane have a single crossover within said Wien filter essentially at said center of the Wien filter, so that one intermediate stigmatic image is formed within said Wien filter essentially at said center of the Wien filter.

5. The apparatus according to claim 1, wherein said Wien filter is further adapted so that, within said Wien filter, an axial fundamental trajectory in an y-z-plane is symmetric with respect to the center of the Wien filter, so that an astigmatic intermediate image is formed at said center of the Wien filter.

6. The apparatus according to claim 1, wherein the intermediate image plane and the intermediate object plane are located outside the Wien filter and are spaced from the center of the Wien filter by the same distance.

7. The apparatus according to claim 1, wherein the dispersion of a charged particle beam vanishes only in a plane of the stigmatic image formed in said intermediate object plane of said second lens.

8. The apparatus according to claim 1, wherein the dispersion of a charged particle beam vanishes in the plane of the stigmatic image formed in said intermediate object plane of said second lens and in all planes downstream the plane of a stigmatic image formed in said intermediate object plane of said second lens.

9. The apparatus according to claim 1, wherein the 2*m-pole element is a quadrupole element.

10. The apparatus according to claim 1, wherein a first aperture means is disposed between said first lens and said Wien filter.

11. The apparatus according to claim 10, wherein said first lens is adapted to focus a charged particle beam in the plane of the first aperture means.

12. The apparatus according to claim 1, wherein a first aperture means is integral with said first lens or said Wien filter.

13. The apparatus according to claim 1, wherein a second aperture means is disposed between said Wien filter and said second lens.

14. The apparatus according to claim 1, wherein a second aperture means is integral with said second lens or said Wien filter.

15. The apparatus according to claim 1, wherein an aperture means comprise associated with the Wien filter or the first or second lens has an opening with a width in the range of 1 µm to 15 µm.

16. The apparatus according to claim 1, wherein the Wien filter is further adapted to form 2*n, n≧1, additional intermediate stigmatic images, wherein n intermediate stigmatic images are formed between the first opening and the center of the Wien filter and n intermediate stigmatic images are formed between the center of the Wien filter and the second opening.

17. A charged particle apparatus comprising:
a charge particle source;
an imaging apparatus including:
  a first lens;
  a Wien filter having a first opening and a second opening, and further, comprising a 2*m-pole element, wherein m≧2; and
  a second lens;
  wherein said first lens is disposed upstream of said first opening of the Wien filter and said second lens is disposed downstream of said second opening of the Wien filter, and an intermediate image plane of the first lens is located between said first opening and said first lens and an intermediate object plane of the second lens is located between said second opening and said second lens;
wherein said Wien filter is adapted for dispersion-free imaging of a stigmatic image formed in said intermediate image plane of said first lens into a stigmatic image formed in said intermediate object plane of said second lens; and
wherein the charged particle apparatus is adapted to switch between a high probe current mode and a monochromator mode.

18. The apparatus according to claim 17, wherein, in the high probe current mode, the Wien filter is adapted for dispersion-free imaging of a stigmatic image formed in an intermediate image plane of the first lens into a stigmatic image formed in the intermediate object plane of the second lens, and the first lens is adapted to focus a beam of charged particles in a plane near said first opening of said Wien filter.

19. The apparatus according to claim 17, wherein, in the high probe current mode, the Wien filter is adapted for dispersion-free imaging of a stigmatic image formed in an intermediate image plane of the first lens into a stigmatic image formed in the intermediate object plane of the second lens, and the first lens is adapted to focus a beam of charged particles essentially in the plane of the first aperture means.

20. The apparatus according to claim 17, wherein in the monochromator mode, the 2*m-pole element is adapted to cancel a focusing effect of the Wien filter in the x-z-plane and focuses in the y-z-plane, and said first lens is adapted to focus a charged particle beam in a plane essentially at said center of the Wien filter.

21. The apparatus according to claim 17, wherein said second lens is adapted to focus a charged particle beam onto a sample (13).

22. The apparatus according to claim 17, further comprising an objective lens for focusing a charged particle beam onto a sample, wherein said objective lens being disposed between said second lens and said sample.

23. The apparatus according to claim 17, further comprising an anode lens disposed between said charged particle source and said first lens.

24. A method of operating an imaging apparatus, comprising:
(a) forming a stigmatic image essentially in an intermediate image plane of a first lens;
(b) dispersion-free imaging of said stigmatic image essentially into an intermediate object plane of a second lens; and
(c) forming a stigmatic image essentially in the intermediate object plane of the second lens.

25. The method according to claim 24, wherein step (b) further comprises the step of adjusting a Wien filter, wherein the Wien filter comprises a 2*m-pole element, m≧2, so that within said Wien filter, an axial fundamental trajectory in the x-z-plane is antisymmetric with respect to the center of the Wien filter.

26. A method of operating a charged particle apparatus, comprising the steps of:
(a) operating said charged particle apparatus in a high probe current mode for dispersion-free imaging of a stigmatic image formed in an intermediate image plane of a first lens into a stigmatic image formed in an intermediate object plane of a second lens or a monochromator mode; and
(b) switching said charged particle apparatus into a monochromator mode or a high probe current mode for dispersion-free imaging of a stigmatic image formed in an intermediate image plane of a first lens into a stigmatic image formed in an intermediate object plane of a second lens.

27. The method according to claim 26, wherein the high probe current mode further comprises the step of adjusting a Wien filter comprising a 2*m-pole element, m≧2, and further adjusting said first lens for focusing the beam of charged particles essentially in a plane of an upstream opening of said Wien filter.

* * * * *

UNITED STATES PATENT AND TRADEMARK OFFICE
CERTIFICATE OF CORRECTION

PATENT NO.       : 7,361,897 B2                          Page 1 of 1
APPLICATION NO.  : 11/370224
DATED            : April 22, 2008
INVENTOR(S)      : Degenhardt It is certified that error appears in the above-identified patent and that said Letters Patent is hereby corrected as shown below:

In the Claims:
Column 16, Claim 15, Line 65, please delete "comprise".

Signed and Sealed this

Eleventh Day of November, 2008

JON W. DUDAS
*Director of the United States Patent and Trademark Office*